United States Patent [19]

Brambilla et al.

[11] Patent Number: 5,942,783
[45] Date of Patent: Aug. 24, 1999

[54] SEMICONDUCTOR DEVICE HAVING IMPROVED LATCH-UP PROTECTION

[75] Inventors: Davide Brambilla, Rho; Edoardo Botti, Vigevano; Paolo Ferrari, Gallarate, all of Italy

[73] Assignee: STMicroelectronics, S.r.l., Agrate Brianza, Italy

[21] Appl. No.: 08/594,805

[22] Filed: Jan. 31, 1996

[30] Foreign Application Priority Data

Jan. 31, 1995 [EP] European Pat. Off. .............. 95830024

[51] Int. Cl.[6] ..................................................... H01L 29/72
[52] U.S. Cl. .......................... 257/372; 257/147; 257/546; 257/550; 257/552; 257/577; 257/593; 438/356; 438/414
[58] Field of Search ...................................... 257/372, 147, 257/546, 550, 552, 577, 593; 438/356, 414

[56] References Cited

U.S. PATENT DOCUMENTS 4,979,001 12/1990 Alter .......................................... 357/13

FOREIGN PATENT DOCUMENTS

| 0 261 556 | 3/1988 | European Pat. Off. ........ H01L 27/02 |
| 0 449 093 | 10/1991 | European Pat. Off. ........ H01L 27/02 |
| A-56-49560 | 7/1981 | Japan .............................. H01L 27/06 |
| A-63-164457 | 11/1988 | Japan .............................. H01L 27/06 |
| WO 89/06047 | 6/1989 | WIPO ............................. H01L 27/08 |
| WO 93/18550 | 9/1993 | WIPO ............................. H01L 27/02 |

*Primary Examiner*—Edward Wojciechowicz
*Attorney, Agent, or Firm*—David V. Carlson; Seed & Berry LLP

[57] ABSTRACT

A semiconductor circuit includes a semiconductor layer having a surface and a monolithic output stage formed in the semiconductor layer. The monolithic output stage extends to the surface of the semiconductor layer and has a periphery within the semiconductor layer, an output terminal, and a supply terminal. A barrier well is formed in the semiconductor layer and adjacent to at least a portion of the periphery of the monolithic output stage. The barrier well extends to the surface of the semiconductor layer and has a first conductivity. A diode having first and second diode regions is disposed in the semiconductor layer. The first diode region is coupled to the supply terminal. The diode is operable to prevent current flow from the barrier well to the supply terminal when the voltage between the supply and output terminals has a first polarity.

23 Claims, 4 Drawing Sheets

SEMICONDUCTOR DEVICE HAVING IMPROVED LATCH-UP PROTECTION

FIELD OF THE INVENTION

This invention relates to a monolithic output stage self-protected against latch-up phenomena, especially in the event of the output stage being improperly connected.

In particular, the invention concerns a power output stage integrated in a semiconductor portion that is isolated by a peripheral barrier well. The description that follows deals with this particular field, and more particularly with an output stage including a vertical PNP power transistor, for convenience of illustration.

BACKGROUND OF THE INVENTION

As is well known in the art, an electronic semiconductor power device, such as power supply, amplifier and similar devices, includes an output stage which is used for driving an electric load. The load is often an inductive one, and is connected to the output terminal of the power device.

Typically, the power output stage is monolithically integrated in a portion of a semiconductor material which is isolated by a peripheral "barrier" well. This barrier well functions to block or restrict electric current that flows between wells adjacent to or contiguous with the barrier well, under certain critical conditions of the circuit operation.

An output stage of this kind would usually include an isolated vertical final transistor of the PNP type.

Shown in FIG. 1 is a vertical section view, not drawn to scale, of a semiconductor material chip, usually of monocrystalline silicon, having an output stage integrated therein which includes a vertical PNP transistor as is known in the art. The semiconductor material substrate of the P type is denoted by 1. The epitaxial layer of the N type is there denoted by 2 as a whole. This epitaxial layer 2 includes a predetermined number of wells, with three such wells, 2', 2" and 2'", separated by isolation regions 3 of the P type shown by way of example. Well 2" is divided into two sides, 2"a and 2"b, as shown. The wells 2', 2" and 2'" extend from the substrate to a surface 4 of the chip. The vertical transistor of the PNP type is integrated in one of the wells, specifically well 2'. This PNP transistor forms the final transistor of the output stage. Indicated outside the well 2', on the left-hand side thereof in FIG. 1, are circuit portions that are formed in the layer 2 and are external to the output stage.

The structure of the PNP transistor includes a buried layer 5 of the N+ type formed at the interface between the substrate 1 and the epitaxial layer 2, and contained within the well 2'. Formed over the buried layer 5 is a first buried collector region 6, of the P type, which is connected to the surface 4 by a second collector region 7, also of the P type, which is annular in shape and extends vertically in FIG. 1 from the region 6 to the surface 4. The perimeter formed by the collector region 7 may have any shape, such as a circle, square, rectangle, triangle, etc. The collector regions 6 and 7 bound and enclose a base region 8 of the N type which is, therefore, isolated both laterally and downwardly. Within this base region 8, an emitter region 9 of the P type is provided. FIG. 1 also shows collector, base and emitter contacts, respectively denoted by C, B and E. The well 2' containing the transistor is also connected to that collector through a contact C1. The transistor collector C is connected, within the output stage, to an output terminal OUT; emitter E is connected to a supply terminal Vcc being applied thereto a constant supply voltage, typically +V; and base B to a driver terminal D of the transistor itself, being connected to a driver circuit not shown in FIG. 1.

Also shown in FIG. 1 is a barrier well 10 of the kind conventionally employed in the art. The barrier well 10 comprises, in particular, a region of the N+ type which is heavily doped and, accordingly, has a low resistance value. As can be seen in FIG. 1, the barrier well is formed inside N-type well 2", between the two sides 2"a and 2"b, and adjacent to the well 2', which contains the PNP transistor.

Region 10 includes an N+ region 110, that is formed as part of the layer 5. Also, the well 2'" includes an N+ contact region 112 that is typically coupled to either ground or the Vcc terminal.

To make the geometric arrangement of the barrier well 10 more clearly understood, FIG. 2 shows a top plan view of a chip portion which contains the output stage. The output stage is generally and schematically represented by a block 11. The barrier well 10 surrounds the output stage 11 and is enclosed by the sides 2"a and 2"b of the well 2". The barrier well 10 is schematically depicted as an uninterrupted square for simplicity, although as stated above, the barrier well 10 may have another shape.

The barrier well 10 would usually be connected to the supply terminal Vcc, as shown in FIGS. 1 and 2, by contacts S. A single contact S is shown in FIG. 2 for simplicity.

The barrier well 10 provided is quite effective under critical conditions of operation, especially where the voltage at the output terminal OUT drops below ground potential. This may happen, for instance, where the load is an inductive one, and during the circuit operation, transient conditions are established on the load. These being conditions of the potential which can trigger parasitic currents between the output stage and outside regions, the connection of the barrier well 10 to a constant supply voltage +V via terminal Vcc is effective to create a preferential current flow path. That is, the barrier well 10 allows current to be drawn from the supply terminal Vcc but not from parts of the integrated circuit which are external of the output stage 11.

For such arrangements, a trend in the art presently favors the manufacturing of devices that are substantially indestructible even when their terminals are incorrectly connected by a user.

The most frequently occurring mistakes, in the context of devices used in audio and industrial power applications, for example, are shown in FIGS. 3a and 3b. Shown schematically in FIGS. 3a and 3b is a power output stage of the kind discussed above, which comprises a PNP transistor, designated T. The block DRIVER generally represents a driver circuit for the transistor T, and is connected to a control terminal, specifically the base terminal D, of the transistor T. Respectively designated OUT and Vcc are the output and supply terminals, like in FIGS. 1 and 2.

In FIG. 3a, the output terminal OUT has been mistakenly connected to the supply voltage +V, and the supply terminal Vcc to ground. FIG. 3b differs from FIG. 3a by the supply terminal Vcc being left unconnected. More precisely, Vcc is connected to a capacitor C1 in FIG. 3b. This is the filter capacitor that would anyhow be present at the supply terminal Vcc. Prior to using the device, i.e. at the time of connecting its terminals, this capacitor is still uncharged, and has been schematically depicted as connected to ground.

In these two typical instances of wrong connection of the device, for an output stage having a barrier well as described above, the barrier well itself may be instrumental to trigger a destructive latch-up phenomena within the output stage.

With reference to FIGS. 3a and 3b, it can be seen that the circuit DRIVER, being connected between the base and the emitter of the transistor T and having an amount of impedance, in the arrangement shown would drive the transistor into a reverse configuration, that is with the collector exchanged for the emitter. In addition, when the voltage applied by mistake between the base and the emitter exceeds the breakdown voltage value of the base/emitter junction, the transistor T is also turned on in reverse.

What can happen to the integrated output stage of the type shown in FIG. 1 is depicted in FIG. 4. FIG. 4 illustrates incorrect connections of the output stage terminals. Also, a first parasitic transistor of the PNP type is shown at T1. The base of T1 is represented by the well 2', whereas the potential +V is present; its emitter is coincident with the collector 6 and 7 of the final PNP transistor of the output stage; and its collector is the substrate 1, and has an associated resistance collector. A second parasitic transistor T2 of the NPN type is linked to the first into a configuration commonly referred to as an SCR (Silicon Controlled Rectifier). Its base is connected to the collector of the first transistor T1, its collector to the base of T1, and its emitter is the barrier well 10. The base resistance $R_{base}$ of transistor T2, and the substrate resistance $R_{substrate}$, are also shown. The other parasitic resistances are omitted for clarity.

In the case of the wrong connection shown in FIG. 4, with the final transistor being operated in the reverse mode as mentioned, the parasitic transistor T1 may be turned on to inject a current into the substrate 1 and raise its potential. Thus, the barrier well 10 becomes the emitter of the second parasitic transistor T2, thereby allowing it to be turned on. The transistor T1, in turn, continues to be active due to the current from the collector of T2. The process is a self-supporting one, and may result in large currents being conducted through the output stage, and in the phenomenon known as latch-up, with likely destruction of the device.

SUMMARY OF THE INVENTION

An object of this invention is to provide a monolithic output stage of the type having a barrier well, which is self-protected from latch-up phenomena even in the event of its terminals being improperly connected, particularly in a reverse manner.

In accordance with the present invention, a monolithic output stage is provided which is self-protected from incidentally occurring destructive latch-up phenomena. The output stage is of the type integrated in a semiconductor portion which is isolated by a peripheral barrier well electrically connected to a terminal, specifically a supply terminal, having a constant voltage applied thereto to promote a flow of current between the barrier and the terminal and reduce current flows between the output stage and external regions. Based on the inventive idea of the present invention, the output stage provides for the barrier well to be coupled to the terminal through a diode which is forward biased from the terminal. In this way, the flow of current from the barrier to the terminal can be blocked, thereby preventing triggering of destructive phenomena for the output stage.

The integrated barrier structure is formed in a region, having a first type of conductivity, of a semiconductor material chip, and comprises a heavily doped well with conductivity of the first type and a substantially annular shape, and being in contact with a large surface of the chip. This structure is characterized in that at least in a portion thereof, located close to contact regions for connection to said terminal, the barrier well is split into first and second heavily doped concentrical regions with the first type of conductivity. The barrier structure further comprises, at the location of said portion, an intermediate region, being less heavily doped and having the same first type of conductivity, and a surface region with a second type of conductivity located within said intermediate region.

In accordance with the invention, the power output stage involved preferably includes a vertical PNP transistor isolated by means of said barrier well.

As used in this document, the words "annular" and "concentric" can denote enclosed perimeters having shapes other than circles. For example, these words may refer to perimeters that are square or rectangular.

BRIEF DESCRIPTION OF THE DRAWINGS

The features and advantages of an output stage according to this invention will be apparent from a detailed description of an embodiment thereof, to be taken by way of non-limitative example with reference to the accompanying drawings. In the drawings.

DETAILED DESCRIPTION OF THE INVENTION

Figure 5:
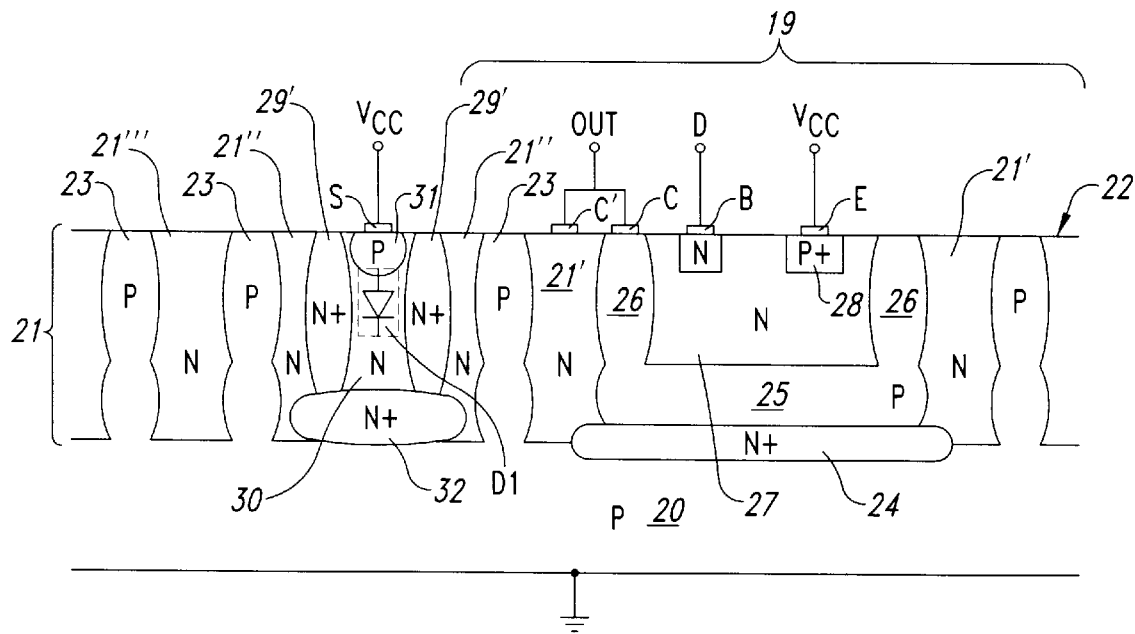
FIG. 5 is a cross-sectional view of an output stage comprising an isolated vertical PNP transistor and a barrier well according to this invention.

Shown, in out-of-scale vertical section in FIG. 5, is a preferred embodiment of this invention. An output stage 19 comprising an isolated vertical final transistor of the PNP type is integrated in a chip of a semiconductor material, usually monocrystalline silicon.

Figure 1:
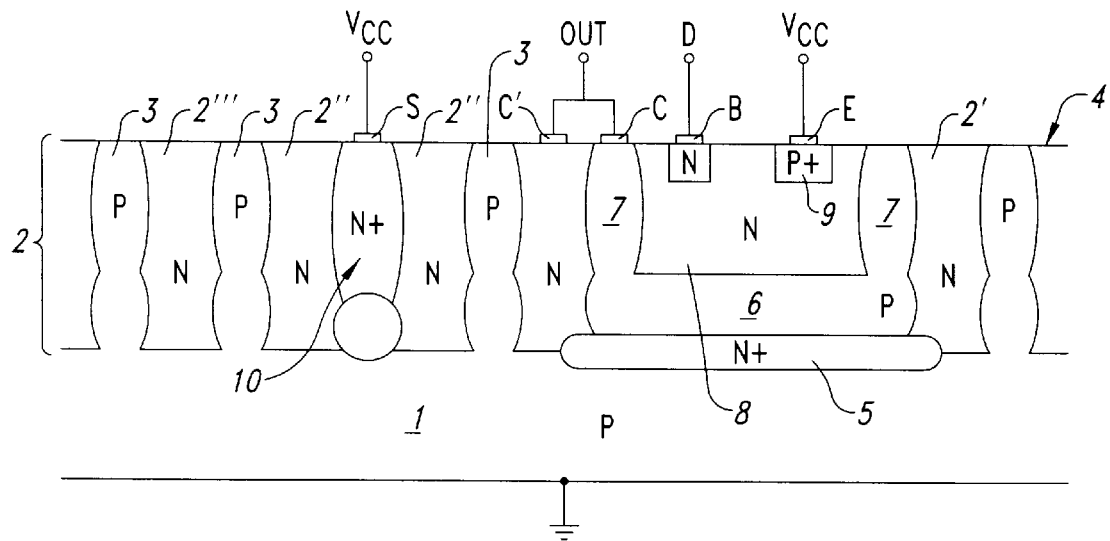
FIG. 1 is a cross-sectional view of an output stage comprising an isolated vertical transistor of the PNP type and a barrier well according to the prior art.
Figure 2:
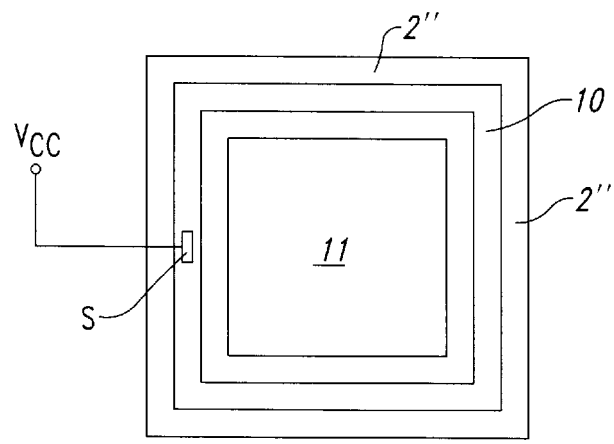
FIG. 2 is a schematic top plan view of the output stage of FIG. 1.
Figure 3A:
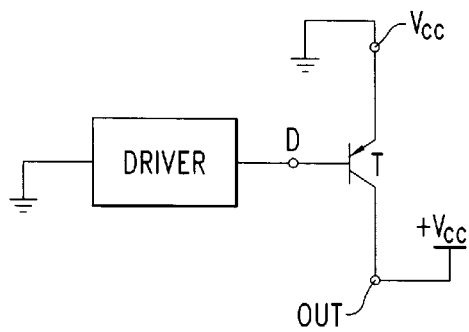
FIGS. 3a and 3b illustrate two possible wrong connections of the output stage terminals of FIG. 1.
Figure 3B:
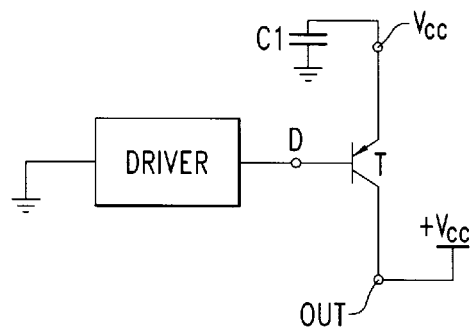
Figure 4:
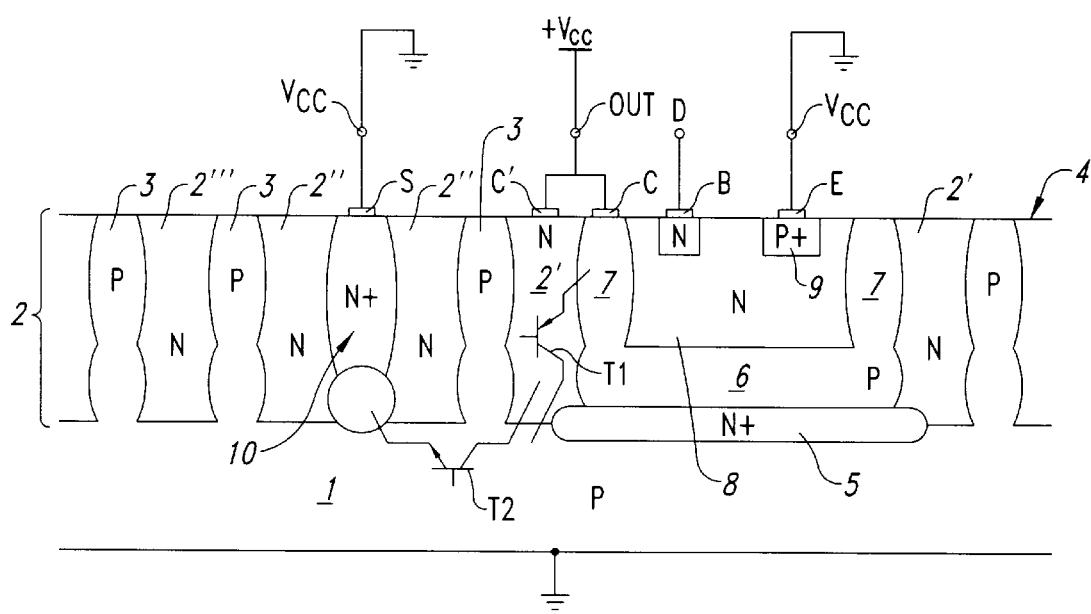
FIG. 4 is a cross-sectional view of the output stage of FIG. 1 where the output stage terminals having been improperly connected.

The semiconductor material substrate of the P type is denoted by 20, and the epitaxial layer of the N type is as a whole denoted by 21. This epitaxial layer 21 has a number of wells, also of the N type, which extend from the substrate to the large surface 22 of the chip. Shown by way of example in FIG. 5 are three wells, 21', 21" and 21"', which are separated by isolation regions 23 of the P type. Well 21" has two sides 21"a and 21"b. Well 21"' has an N+ contact region 114, which is typically coupled either to ground via P region 23 or to terminal Vcc via a metal line (not shown) in series with the N+ region 29'. One of these wells, namely, well 21', has the PNP-type transistor integrated therein. This PNP transistor is the final transistor of the output stage and is formed by the conventional technique illustrated in FIGS. 1 and 4.

The structure of the PNP transistor includes a buried layer 24 of the N+ type, which is formed at the interface between the substrate 20 and the epitaxial layer 21 in a region within the well 21'. Formed over the buried layer 24 is a first buried collector region 25 of the P type, which is connected to the surface 22 by a second collector region 26, also of the P type, which is annular in shape and extends from the region 25 to the surface 22. The collector regions 25 and 26 bound and enclose (except along the surface 22) a base region 27 of the N type, which is isolated, laterally as well as vertically. An emitter region 28 of the P type is provided within this region 27. In FIG. 5, C, B and E are collector, base and emitter contacts, respectively, of the PNP transistor. The well 21', which contains the transistor, is also connected to the collector C by means of a contact C'. The collector C of the transistor is connected to an output terminal OUT, the emitter E being connected to a supply terminal Vcc, and the base B being connected to a control terminal D, which connects to a driver circuit not shown in FIG. 5.

Outside the well 21', on the left side in FIG. 5, circuit parts external to the output stage are shown. The wells 21" and 21'" of the N type represent integrated circuit regions which are external to the output stage.

As shown in FIG. 5, a barrier structure comprising a barrier well 29 is formed, in accordance with the invention, in the well 21" next to the well 21', which contains the PNP transistor. The barrier well 29 comprises a region of the N+ type, that is a relatively heavily doped, and hence a low resistance, region. The well 29 includes additional regions at least at those contacts S with the supply terminal Vcc which are formed on the large surface 22 of the chip. The section line shown in FIG. 5 passes through one of these contacts S. The barrier structure in such regions has the barrier well split into two concentrical regions 29' and 29", which are both of the N+ type. A further buried region 32, being similarly doped N+, interconnects the bottoms of the two regions 29' and 29", mainly for the purpose of reducing the series resistance of the well.

In accordance with this invention, the barrier well 29 is connected to a terminal Vcc to which is applied a constant voltage, specifically the supply voltage V+, through at least one diode D1 which is forward biased from the supply terminal Vcc.

In the preferred embodiment illustrated in FIG. 5, the diode D1 is formed inside the barrier well 29, at the locations of the regions where the well is split. The diode D1 comprises an intermediate region 30 of the N type, included between the two regions 29' and 29", and an overlying region 31 of the P type. The region 31 extends to the contact of the supply terminal Vcc on the large surface 22 of the chip. The intermediate region 30 is practically a portion of the well 21".

The barrier well 29 is located laterally of the diode, with the regions 29' and 29" out of contact with the region 31 of the P type.

Advantageously, the barrier structure which comprises the barrier well 29, i.e., the two concentrical regions 29' and 29", and the diode D1 can be provided by forming a barrier region 29 of the N+ type. An aperture is provided in the region 29 at the location of the diode D1 to be formed, specifically at the contacts S. This aperture leaves the well region 21" in the central area where the N region of the diode D1 will be formed. The diode D1 is then completed by forming a surface region of the P type, namely region 31.

It should be considered that a region of the P type is preferably formed in an N region. This process, therefore, enables the region 31 to be provided inside the aperture of the N type formed between the regions 29' and 29".

Figure 6:
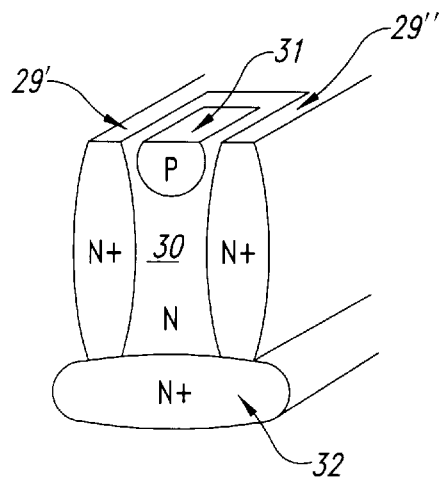
FIG. 6 is a perspective view of a portion of the barrier well of FIG. 5 according to this invention.

Shown in FIG. 6 is a perspective view of the well 29 and the diode D1 according to this invention. FIG. 6 shows that the diode D1 is only formed in a portion of the barrier well, close to a contact S (not shown in FIG. 6).

Figure 7:
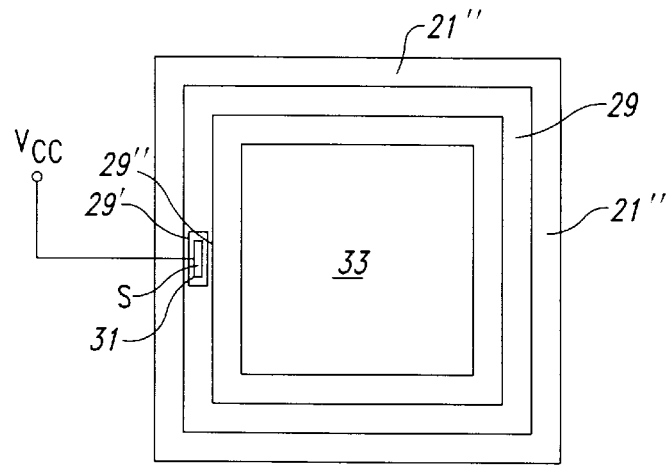
FIG. 7 is a top plan view of the output stage of FIG. 5 which includes a barrier well formed in accordance with this invention.

To further clarify the geometry of the barrier well 29, FIG. 7 shows a top plan view of a portion of a chip which contains the output stage, schematically indicated by the block 33. Shown in FIG. 7 is the barrier well 29, which surrounds the periphery of the output stage 33. The well 29 is schematically shown as having a square shape for simplicity, although as stated above, the wells 29 of other embodiments may have other shapes. Furthermore, the well 29 is shown uninterrupted in FIG. 7, although a discontinuous barrier well would also fall within the scope of the invention. Also shown is the arrangement of the diode D1, inside the barrier well 29 at a contact S of the well 29 with the supply terminal Vcc.

Shown in FIG. 7 is a single diode, but multiple diodes could be provided within the barrier well at different connections to the supply terminal Vcc.

It should be noted that the barrier well 29 may be split into regions 29' and 29" either all around its periphery or just at the diode or diodes D1.

Figure 8:
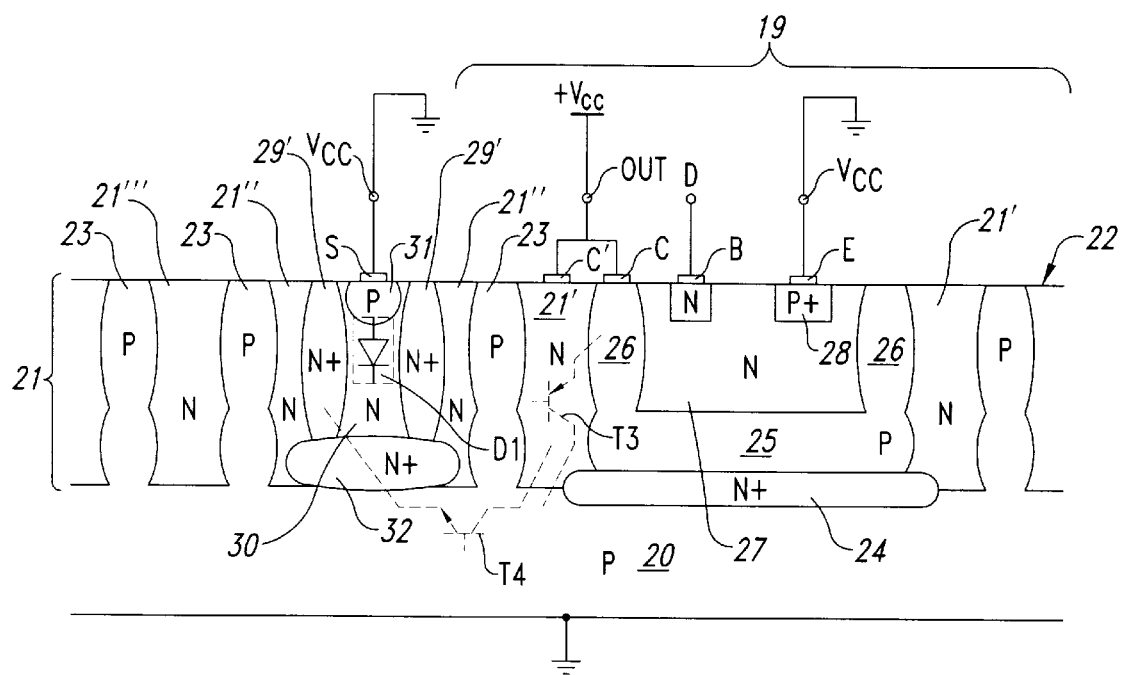
FIG. 8 is a cross-sectional view of the output stage of FIG. 5 according to the invention and having its terminals improperly connected.

FIG. 8 shows a section through the output stage 19 and the barrier well 29 with the diode D1, wherein the terminals Vcc and OUT of the output stage have been improperly connected. The same reference numerals are used in FIG. 8 as in FIG. 5. As shown in FIG. 8, by mistake, the output terminal OUT has been connected to the supply voltage +V, while the supply terminal Vcc, to which the barrier well 29 is also connected via the diode D1, has been connected to ground.

Also shown in FIG. 8 are parasitic transistors T3 and T4 which form a configuration of the SCR type. The first parasitic transistor T3 is of the PNP type. Its base is represented by the well 21', on which the potential +V is present, its emitter is coincident with the collector, 25 and 26, of the final PNP transistor of the output stage, and its collector is the substrate 20. The second parasitic transistor T4 of the NPN type has its base connected to the collector of the first transistor T3, its collector connected to the base of T3, and its emitter formed by the barrier well 29. Also shown are the base resistance $R_{base}$ of the transistor T4, the collector resistance $R_{collector}$ of the transistor T3, and the substrate resistance $R_{substrate}$.

In the case of the wrong connection shown in FIG. 8, the parasitic transistor T3 is activated because of the vertical final transistor PNP being operated in the reverse mode. According to the invention, however, the transistor T4 is prevented from being turned on by virtue of the diode D1 being connected to the barrier well 29, and hence to the emitter of T4. In this way, the triggering of destructive output stage latching-up, as due to the structure of the SCR type comprising the transistors T3 and T4, can be effectively prevented.

Also, the provision of the diode D1 according to the invention allows a current to flow in the direction from the supply terminal Vcc to the barrier well 29, thereby enabling the latter to perform its function as discussed in connection with the prior-art devices of FIGS. 1–4.

In addition, the output stage of this invention is simple to make.

The present invention can be used in particular for a so-called full-swing output stage comprising, as its final transistors, a PNP transistor and an NPN transistor. In this case, the transistors could each be partially surrounded by a barrier well according to the invention. This type of output stage can be used in audio and industrial applications.

It should not be overlooked that the output stage referred to in this specification is a power output stage, so that the currents flowed therethrough may be quite large. On the other hand, the latch-up phenomenon becomes more destructive with larger currents. However, this invention can be used to advantage even in devices other than power ones.

This invention is also effective where the supply terminal connected to the barrier well is mistakenly connected to a voltage other than zero, and in any case below the supply voltage +V.

Furthermore, the opposite polarities from those described above are also encompassed by the inventive concept, in particular a barrier well of the P type and supply voltage −Vcc.

Thus, the barrier structure described acts as a restrictor of current flow between structures provided laterally thereof, and can be used, particularly but not solely, with an output stage which comprises a vertical PNP power transistor.

It will be appreciated that, although specific embodiments of the invention have been described herein for purposes of illustration, various modifications may be made without departing from the spirit and scope of the invention. Accordingly, the invention is not limited except as by the appended claims.

We claim:

1. A semiconductor circuit, comprising:
    a semiconductor layer having a surface;
    a monolithic output stage formed in said semiconductor layer, said monolithic output stage extending to said surface of said semiconductor layer and having a periphery within said semiconductor layer, an output terminal, and a supply terminal;
    a barrier well formed in and extending into said semiconductor layer and adjacent to at least a portion of said periphery of said monolithic output stage, said barrier well extending to said surface of said semiconductor layer and having a first conductivity type different than a conductivity type of said periphery of said monolithic output stage and forming an isolation region therewith; and
    a first region disposed within said barrier well, having a second conductivity type, contiguous with said surface of said semiconductor layer, and coupled to said supply terminal of said monolithic output stage, said first region and a portion of said barrier well defining a diode that is forward biased when a voltage between said supply and output terminals of said monolithic output stage is a first polarity and that is reverse biased when said voltage is a second polarity, where said second polarity is incorrect for operation of said monolithic output stage and said first polarity is correct for operation of said monolithic output stage.

2. The semiconductor circuit of claim 1, wherein said first region is coupled to said supply terminal so as to prevent latch-up phenomena from being triggered in said output stage when said voltage has said second polarity.

3. The semiconductor circuit of claim 1, wherein said first region is disposed within a region of said barrier well that is less heavily doped than, and is of a same conductivity type as, said barrier well.

4. The semiconductor circuit of claim 3 wherein said barrier well has an annular shape, wherein, at least in one portion, said barrier well is divided into at least two concentrical regions, and said less heavily doped region is disposed intermediate the two concentrical regions.

5. The semiconductor circuit of claim 4 wherein said two concentrical regions have high concentrations of dopant of said first conductivity type and wherein said first region is a surface portion of said less heavily doped region, said first region separated from said two concentrical regions by said less heavily doped region.

6. The semiconductor circuit of claim 1, wherein said output stage includes a vertical power PNP transistor integrated in a first n-type well and said barrier well is formed by n-type diffusion at a high dopant concentration within a second n-type well outside said first well, wherein said first region comprises a surface p-type region disposed within an n-type region that is less heavily doped than said barrier well and that is formed in at least one portion of said barrier well, said surface p-type region being coupled to said supply terminal.

7. The semiconductor circuit of claim 1 wherein said monolithic output stage is formed using a bipolar power technique.

8. An integrated barrier structure formed within a region of a semiconductor layer having a surface and a first conductivity type, said barrier structure comprising:
    a heavily doped well having said first conductivity type and a substantially annular shape, said heavily doped well contiguous with the surface of said semiconductor layer and extending into a thickness of said semiconductor layer;
    an intermediate region disposed within a portion of said heavily doped well, said intermediate region being less heavily doped than said well, having said first conductivity type, and having a surface contiguous with said surface of said semiconductor layer; and
    a surface region with a second conductivity type located within said intermediate region.

9. The integrated barrier structure of claim 8 wherein said surface region includes a metallic contact to which is applied a constant voltage, said surface region separated from said heavily doped well by said intermediate region.

10. The integrated barrier structure of claim 8, further comprising a heavily doped deep layer having said first conductivity type and contiguous with said heavily doped well such that said deep layer borders a side of said intermediate region that is opposite said surface of said intermediate region.

11. The integrated barrier structure of claim 8, wherein said first conductivity type is n-type, and said second conductivity type is p-type.

12. A process for forming an integrated barrier structure, comprising:
    forming a containment well extending into a thickness of a layer of semiconductor material, said containment well having a first conductivity type;
    forming a barrier well extending into said containment well, said barrier well having said first conductivity type and being more heavily doped than said containment well;
    forming at least one region of reduced doping in said barrier well, said at least one region of reduced doping having said first conductivity type, being less heavily doped than said barrier well, and being peripherally surrounded by said barrier well; and
    forming, within said at least one region of reduced doping, a surface region having a second conductivity type and being peripherally surrounded by said at least one region of reduced doping, said surface region forming a p-n junction with said region of reduced doping.

13. The process of claim 12 wherein said step of forming said surface region includes a step of forming a metallic contact on said surface region, said metallic contact operable to receive a constant voltage.

14. The process of claim 12 wherein:

said step of forming said barrier well includes a step of forming a heavily doped n-type barrier well; and said step of forming said surface region includes a step of forming a p-type surface region.

15. A semiconductor device, comprising:

a substrate of a first conductivity type;

a layer of a second conductivity type formed on said substrate and having a surface;

a collector region of said first conductivity type formed in said layer and having an outer wall;

a base region of said second conductivity type formed in said collector region;

an emitter region of said first conductivity type formed in said base region;

an isolation region of said first conductivity type formed in said layer and peripherally surrounding said outer wall of said collector region said isolation region also having an outer wall;

a barrier well of said second conductivity type formed in said layer and peripherally surrounding said outer wall of said isolation region;

an electrical contact region of said first conductivity type formed in said barrier well;

a power terminal coupled to said emitter and contact regions;

an output terminal coupled to said collector region; and a control terminal coupled to said base region.

16. The device of claim 15 wherein said first conductivity is p-type, and said second conductivity is n-type.

17. The device of claim 15 wherein said collector region comprises:

a first collector portion of said first conductivity type buried in said layer; and a second collector portion of said first conductivity type extending between said first collector region and said surface of said layer.

18. The device of claim 15 wherein said barrier well comprises:

a first barrier region of said second conductivity type buried in said layer;

a second barrier region of said second conductivity type extending between said first barrier region and said surface of said layer;

a third barrier region of said second conductivity type spaced apart from said second barrier region and extending between said first barrier region and said surface of said layer;

said first, second and third barrier regions defining therebetween a fourth barrier region of said second conductivity type; and said contact region formed in said fourth barrier region and contiguous with said surface of said layer.

19. The device of claim 18 wherein:

said first, second, and third barrier regions have a first impurity concentration; and said fourth barrier region has a second impurity concentration significantly less than said first impurity concentration.

20. A semiconductor circuit, comprising:

a semiconductor layer having a surface;

a monolithic output stage formed in the semiconductor layer, the monolithic output stage extending to the surface of the semiconductor layer and having a periphery within the semiconductor layer, an output terminal, and a supply terminal;

a barrier well formed in and extending into a thickness of the semiconductor layer and being adjacent to at least a portion of the periphery of the monolithic output stage, the barrier well extending to the surface of the semiconductor layer and having a first conductivity type different than a conductivity type of said periphery of said monolithic output stage and forming an isolation region therewith;

a diode having first and second diode regions disposed in the semiconductor layer, the first diode region being coupled to the supply terminal and the second diode region being coupled to the barrier well, the diode operable to prevent current flow from the barrier well to the supply terminal when the voltage between the supply and output terminals has a first polarity that is incorrect for operation of said monolithic output stage.

21. The semiconductor circuit of claim 20 wherein:

the first diode region is disposed within the barrier well and has a second conductivity; and the second diode region comprises a portion of the barrier well.

22. The semiconductor circuit of claim 20, further comprising:

a barrier region disposed within the barrier well, having the first conductivity, and having an impurity concentration that is less than an impurity concentration of the barrier well;

wherein the first diode region is disposed within the barrier region and has a second conductivity; and wherein second diode region comprises a portion of the barrier region.

23. An integrated barrier structure formed within a region of a semiconductor layer having a surface and a first conductivity type, said barrier structure comprising:

a heavily doped well having said first conductivity type and a substantially annular shape, said heavily doped well contiguous with the surface of said semiconductor layer and extending into a thickness of said semiconductor layer;

an intermediate region disposed within a portion of said heavily doped well, said intermediate region being less heavily doped than said well, having said first conductivity type, and having a surface contiguous with said surface of said semiconductor layer;

a surface region with a second conductivity type located within said intermediate region; and an isolation region of said second conductivity type contained within and surrounded by said heavily doped well.

* * * * *